United States Patent
Hsu

[11] Patent Number: 6,165,831
[45] Date of Patent: Dec. 26, 2000

[54] METHOD OF FABRICATING A BURIED CONTACT IN A STATIC RANDOM ACCESS MEMORY

[75] Inventor: Chen-Chung Hsu, Taichung, Taiwan

[73] Assignee: United Microelectronics Corp., Hsinchu, Taiwan

[21] Appl. No.: 09/196,877

[22] Filed: Nov. 20, 1998

[51] Int. Cl.[7] .................................................. H01L 21/8244
[52] U.S. Cl. ...................... 438/238; 438/210; 438/385; 438/533; 438/586
[58] Field of Search ................................ 438/238, 239, 438/210, 586, 533, 382, 384, 385

[56] References Cited

U.S. PATENT DOCUMENTS

| | | | |
|---|---|---|---|
| 5,162,259 | 11/1992 | Kolar et al. | 438/238 |
| 5,168,076 | 12/1992 | Godinho et al. | 438/238 |
| 5,580,806 | 12/1996 | Chang et al. | 438/238 |
| 5,700,711 | 12/1997 | Hsu et al. | 438/238 |
| 5,866,451 | 2/1999 | Yoo et al. | 438/241 |
| 5,956,585 | 9/1999 | Wen | 438/238 |
| 6,022,794 | 2/2000 | Hsu | 438/592 |

*Primary Examiner*—Michael Trinh
*Attorney, Agent, or Firm*—Hickman Coleman & Hughes, LLP

[57] ABSTRACT

A method of fabricating a static random access memory. A substrate having a gate is provided. A source/drain region is formed in the substrate beside the gate. A metal silicide layer is formed on the source/drain region and the gate region. A conductive line which is electrically coupled to the metal silicide layer on the source/drain region is formed over the substrate. A dielectric layer having a via is formed over the substrate. A portion of the conductive line is exposed by the via. A polysilicon conductive line is formed conformably to the via and the dielectric layer. The polysilicon conductive line is electrically coupled to the conductive line. An ion implantation is performed to form a poly load of the static random access memory.

19 Claims, 8 Drawing Sheets

METHOD OF FABRICATING A BURIED CONTACT IN A STATIC RANDOM ACCESS MEMORY

BACKGROUND OF THE INVENTION

1. Field of Invention

The present invention relates to a method of manufacturing a static random access memory (SRAM). More particularly, the present invention relates to a method of fabricating a buried contact in the SRAM.

2. Description of Related Art

Since static random access memory (SRAM) is one of the fastest operating semiconductor memory devices, it is widely used in computer equipment for the storage and retrieval of data. At present, SRAMs are extensively used in digital products including microcomputers and microprocessor systems.

In general, a SRAM can be divided into two structural regions, namely a memory cell region and a peripheral circuit region. The memory cell is used for storing binary data, whereas, the peripheral circuit region has a number of address decoders, which are used to decode memory cell addresses issued from the memory cell region as well as to control related memory circuits. FIG. 1 is a diagram showing the circuit of a conventional SRAM cell.

As shown in FIG. 1, a typical SRAM memory cell comprises resistors (or reactance elements) $R_1$, $R_2$, and MOS transistors $T_1$, $T_2$, $T_3$ and $T_4$. The resistor $R_1$ and the MOS transistor $T_1$ are connected in series, and the drain terminal and the source terminal of the MOS transistor $T_1$ are connected to a voltage source $V_{DD}$ and a ground line $V_{SS}$, respectively. Similarly, the resistor $R_2$ and the MOS transistor $T_2$ are connected in series, and the drain terminal and the source terminal of the MOS transistor $T_2$ are connected to the voltage source $V_{DD}$ and the ground line $V_{SS}$, respectively.

The gate terminal of the MOS transistor $T_2$, the drain terminal of the MOS transistor $T_1$ and the drain terminal of the MOS transistor $T_3$ are electrically connected at node point A. Similarly, at node point B, the gate terminal of the MOS transistor $T_1$, the drain terminal of the MOS transistor $T_2$ and the drain terminal of the MOS transistor $T_4$ are connected together. The gate terminals of MOS transistors $T_3$ and $T_4$ are both connected to a word line WL, whereas the source terminals of the MOS transistors $T_3$ and $T_4$ are connected to a bit line BL and a complementary bit line $\overline{BL}$, respectively. Functionally, the transistors $T_1$ and $T_2$ act as drivers, the transistors $T_3$ and $T_4$ act as storage and retrieval controllers for accessing the data stored inside the memory cell, and the resistors $R_1$ and $R_2$ serve as loads.

In the past, most SRAM contact window structures are formed above the source/drain region. However, due to the need for highly integrated circuits, conventional contact window structures have become inefficient. Consequently, a buried contact window structure suitable for fabricating local interconnects is invented. The buried contact structure is capable of reducing area occupation by up to 25%, for example, in SRAM. Hence, a buried contact window structure is indispensable in the fabrication of high-density electronic products.

Conventionally, a buried contact window is formed by depositing a polysilicon layer over the buried contact window region of a substrate. Then, the substrate is heated, allowing the dopants in the polysilicon layer to diffuse into the silicon substrate. The doped polysilicon layer remaining above the buried contact window region acts as a contact between the buried contact window region and conductive line. However, should misalignment occur when the polysilicon layer is etched, a portion of the substrate inside the buried contact window region will be exposed. As the polysilicon layer is over-etched, a buried contact window trench will be formed. The presence of this buried contact window trench will interfere with the transistor's current flow path, thereby leading to device malfunction.

To understand the situation better, the process of fabricating a conventional SRAM is described with reference to FIGS. 2A through 2I. FIGS. 2A through 2I are cross-sectional views showing a conventional method of fabricating a static random access memory.

As shown in FIG. 2A, a semiconductor substrate 200 is provided. The substrate 200 has a device isolating structure, for example, shallow trench isolation (STI) 202. A gate oxide layer 204 is formed on the semiconductor substrate 200, and then a conductive layer 206 is formed on the gate oxide layer 204. The conductive layer 206 and the gate oxide layer 204 are patterned to expose the substrate region between the STI region 202 and the conductive layer 206/gate oxide layer 204. The exposed substrate region 207 between the STI region 202 and the conductive layer 206/gate oxide layer 204 is the region for forming a buried contact window.

Next, as shown in FIG. 2B, an ion implantation is carried out, to implant ions into the desired contact window region in the semiconductor substrate 200 (the arrows as shown in FIG. 2B). Subsequently, conventional annealing is applied to form a heavily doped $N^+$ region 208.

Next, as shown in FIG. 2C, a conductive layer 216 is deposited over the semiconductor substrate 200. A metal silicide layer 212 is formed on the conductive layer 216 to lower the resistance between the heavily doped $N^+$ region 208 in the buried contact window region and a conductive line.

Next, as shown in FIG. 2D, a gate patterning process is performed. In other words, a photoresist layer (not shown) is formed on the metal silicide layer 212. Then, a multi-layered stack including the metal silicide layer 212, the conductive layer 216 and the conductive layer 206 are etched. Hence, a gate 217 and a conductive line 227 electrically coupled to the heavily doped $N^+$ region 208 are formed.

However, the heavily doped $N^+$ region 208, the conductive layer 216 and the conductive layer 206 are all made from the same material. Hence, in the aforementioned gate processing operation, should misalignment occur, a trench 209 is formed in the heavily doped $N^+$ region of the buried contact window region. The size of the trench 209 depends on the degree of over-etching. If the degree of over-etching is small, a shallow trench 209 is formed. A shallow trench in the heavily doped $N^+$ region reduces the cross-sectional area of the heavily doped $N^+$ region 208 in the buried contact window region, thus leading to an increase in resistance. On the other hand, if the degree of over-etching is large, a deep trench 209 is formed. A deep trench in the heavily doped $N^+$ region cuts off its connection with subsequently formed source/drain region to make an open-circuit.

Next, as shown in FIG. 2E, another ion implantation (arrows 220 in FIG. 2E) is performed to form a source/drain region 237 in the substrate 200. In other words, using the gate 217 and the conductive layer 227 as masks, ions are implanted into the exposed semiconductor substrate 200 in region labeled 237. Then, the substrate 200 is annealed to form a lightly doped $N^-$ region 218.

Next, as shown in FIG. 2F, an insulating layer is deposited over the semiconductor substrate 200, covering the gate 217, the conductive line 227 and the lightly doped N⁻ region 218. An anisotropic etching is carried out to the insulating layer to form spacers 224 on the sidewalls of the gate 217 and the conductive line 227. The spacers 224 cover a portion of the lightly doped N⁻ region 218. Consequently, the spacer 224 can be used as a mask for forming the heavily doped region with a lightly doped drain (LDD) structure.

As shown in FIG. 2G, yet another ion implantation (arrows labeled 218 in FIG. 2G) is carried out implanting ions into the source/drain region. In other words, ions having a high concentration are implanted into the lightly doped N⁻ region 218. The substrate 200 is annealed to form a source/drain region having a lightly doped drain (LDD) structure, in which the LDD structure includes the lightly doped N⁻ region 218 and the heavily doped N⁺ region 228. Since a portion of the substrate 200 is covered by spacer 224, very few ions can have sufficient penetrating power to end up in that region. Therefore, regions having different dopant concentration are produced. Up to this stage, a complete buried contact window of an SRAM cell is fabricated.

As shown in FIG. 2H, a dielectric layer 238, commonly an oxide layer, is formed over the substrate 200 by CVD. A chemical mechanical polishing (CMP) method is performed for planarization of the dielectric layer to make the dielectric layer and a subsequently formed via having the same surface level. Thereafter, a via 242 is formed in the dielectric layer 238 to expose the metal silicide layer 212 for forming the desired via 242 by a photolithography and an etching methods.

As shown in FIG. 2I, a poly load 244 is formed along the via 242 for being electrically coupled to the metal silicide layer 212. The step is preferably to form a polysilicon layer conformal to the dielectric layer 238 and the via 242 by CVD. Then, the polysilicon layer is patterned to form a polysilicon conductive line. An ion implantation is performed for adjusting the resistance of the polysilicon conductive layer to form the poly load 244.

In summary, the conventional method can easily lead to the over-etching of the heavily doped N⁺ region 208 in the buried contact window region when the gate 217 and the conductive line 227 are etched. Consequently, trench 209 is formed. Moreover, the size of the trench 209 depends on the degree of over-etching. If the degree of over-etching is small, a shallow trench 209 is formed. A shallow trench in the heavily doped N⁺ region will reduce the cross-sectional area of the heavily doped N⁺ region 208 in the buried contact window region, thus leading to an increase in resistance. On the other hand, if the degree of over-etching is large, a deep trench 209 is formed. A deep trench in the heavily doped N⁺ region cuts off its connection with subsequently formed source/drain region.

In light of the foregoing, there is a need to provide an improved method of forming buried contact window in SRAM cell.

SUMMARY OF THE INVENTION

Accordingly, the present invention is to provide a method of fabricating a static random access memory. It is capable of preventing any trench formation in a buried contact window due to misalignment, thereby lowering contact resistance between the buried contact window and a conductive line region.

To achieve these and other advantages and in accordance with the purpose of the invention, as embodied and broadly described herein, the invention provides a method of fabricating a static random access memory. A substrate having a gate is provided. A source/drain region is formed in the substrate beside the gate. A metal silicide layer is formed on the source/drain region and the gate region. A conductive line which is electrically coupled to the metal silicide layer on the source/drain region is formed over the substrate. A dielectric layer having a via is formed over the substrate. A portion of the conductive line is exposed by the via. A polysilicon conductive line is formed conformably to the via and the dielectric layer. The polysilicon conductive line is electrically coupled to the conductive line. An ion implantation is performed to form a poly load of the static random access memory.

It is to be understood that both the foregoing general description and the following detailed description are exemplary, and are intended to provide further explanation of the invention as claimed.

BRIEF DESCRIPTION OF THE DRAWINGS

The accompany drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
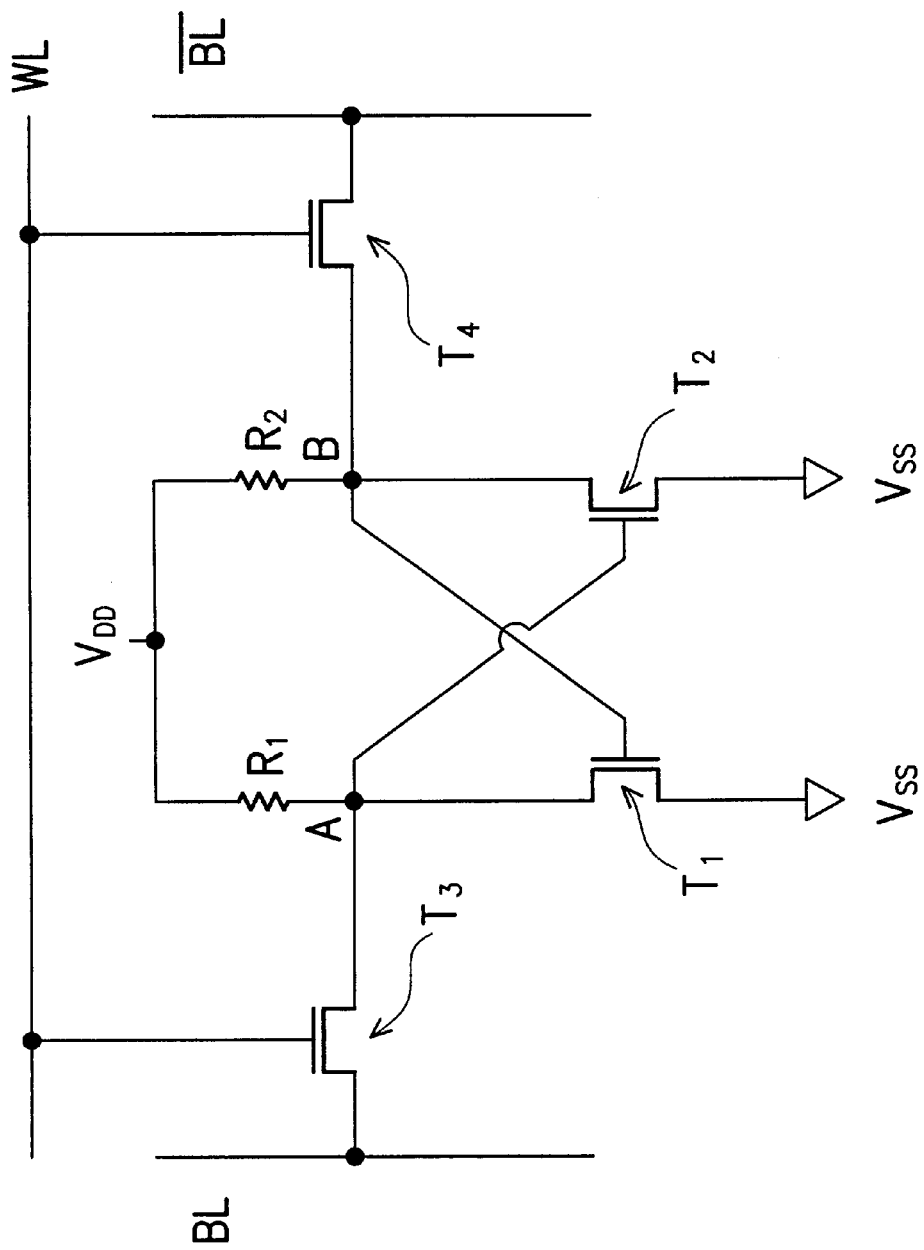
FIG. 1 is a diagram showing the circuit of a conventional SRAM cell.
Figure 2A:
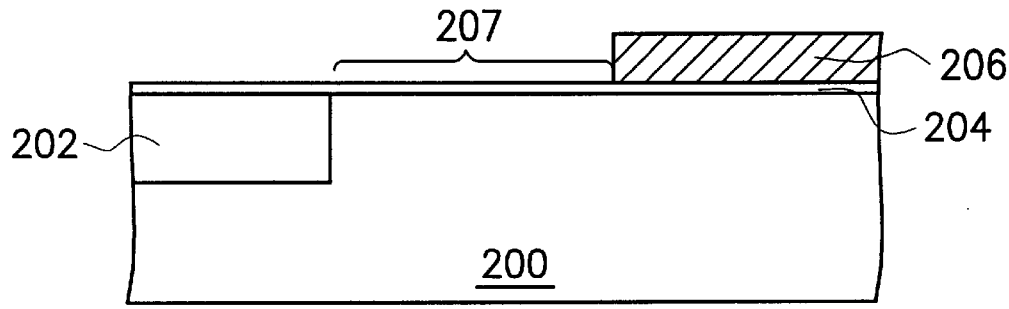
FIGS. 2A through 2I are cross-sectional views showing a conventional method of fabricating a static random access memory.
Figure 2B:
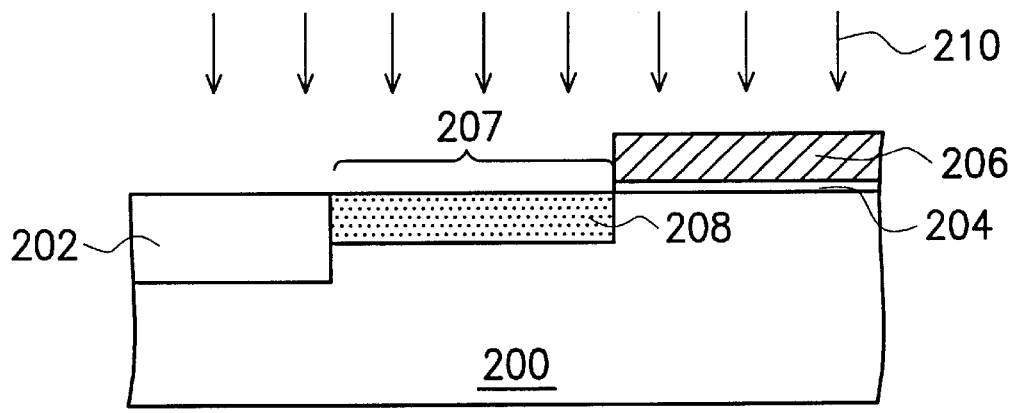
Figure 2C:
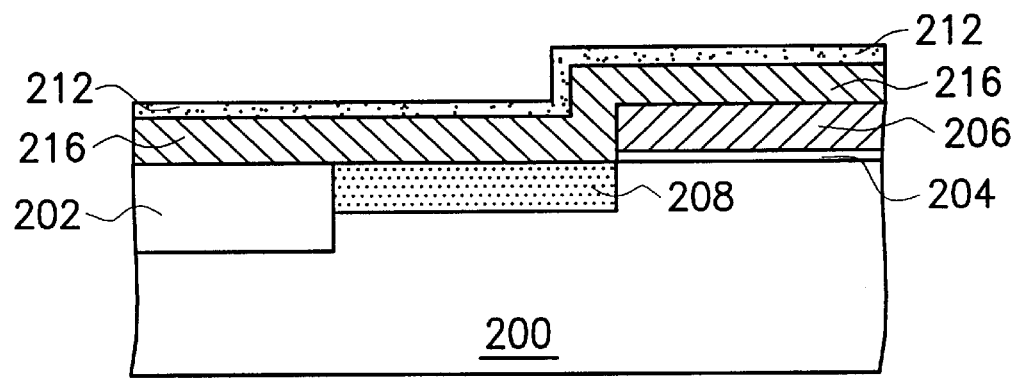
Figure 2D:
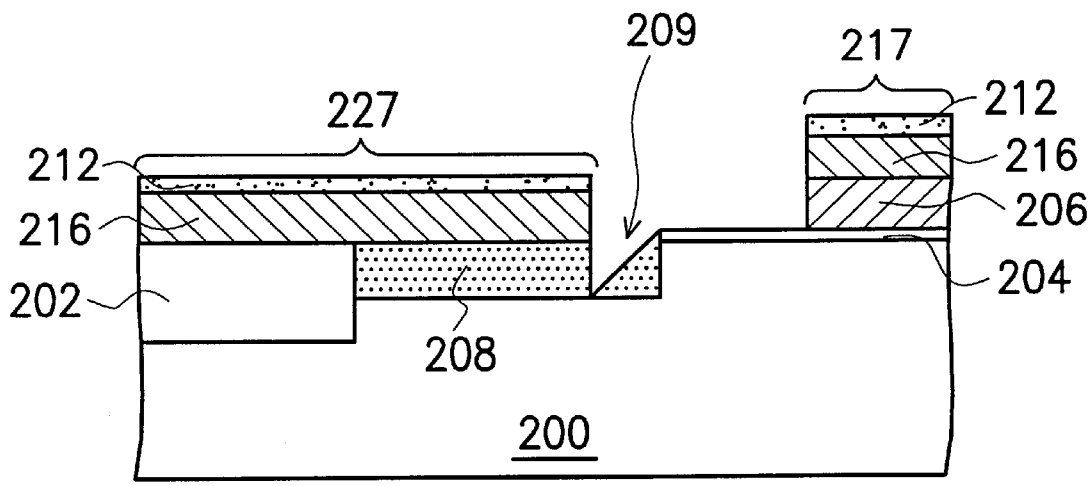
Figure 2E:
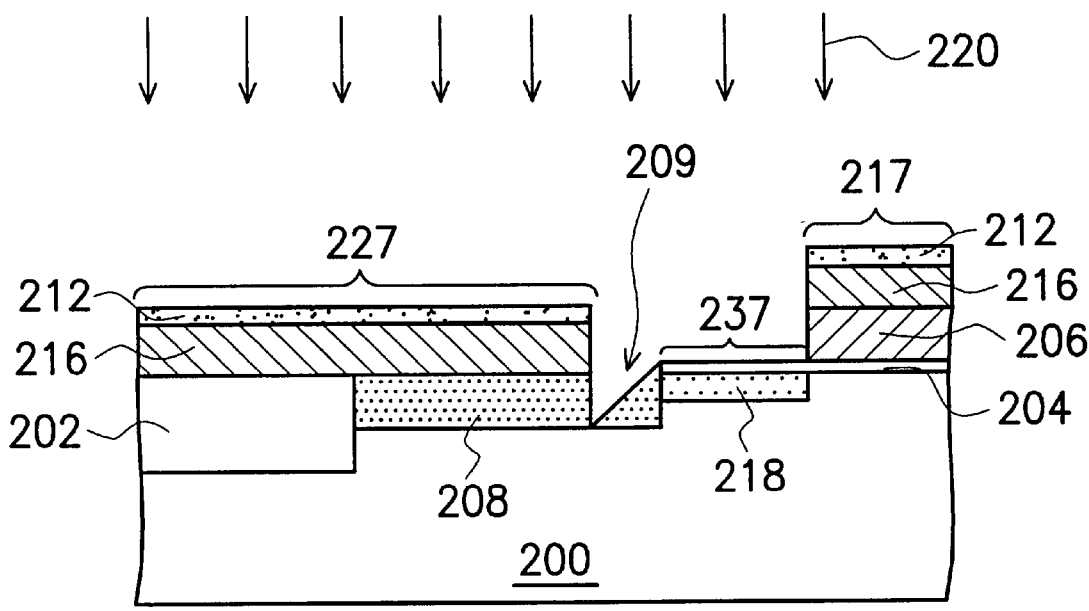
Figure 2F:
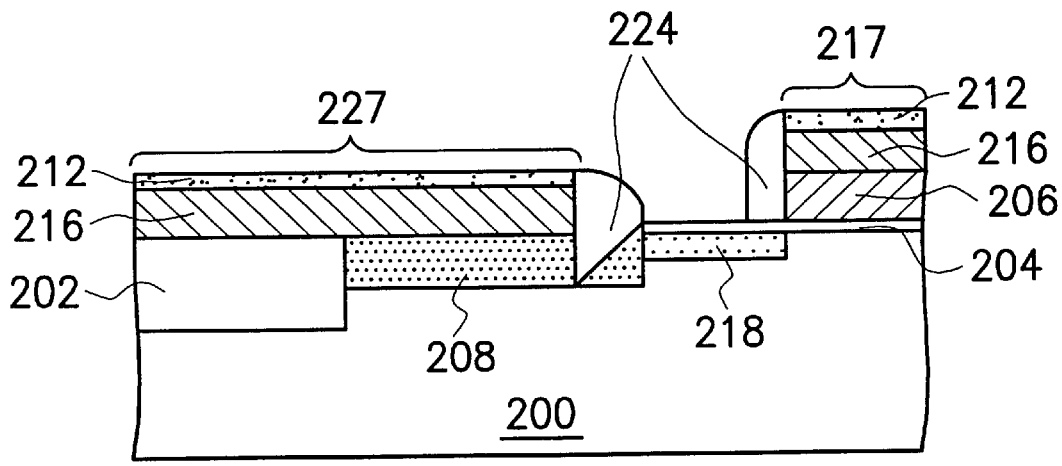
Figure 2G:
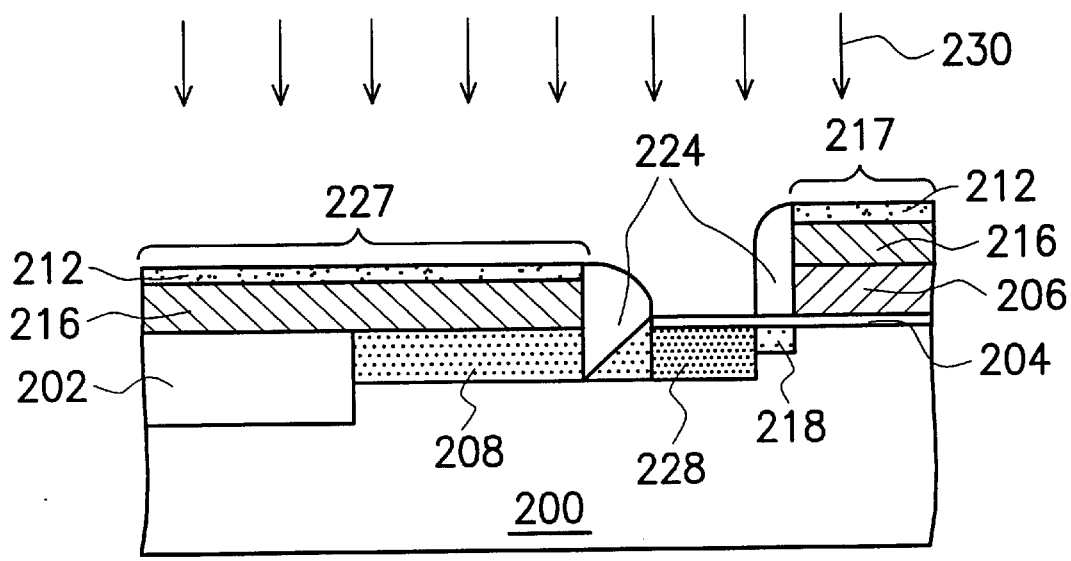
Figure 2H:
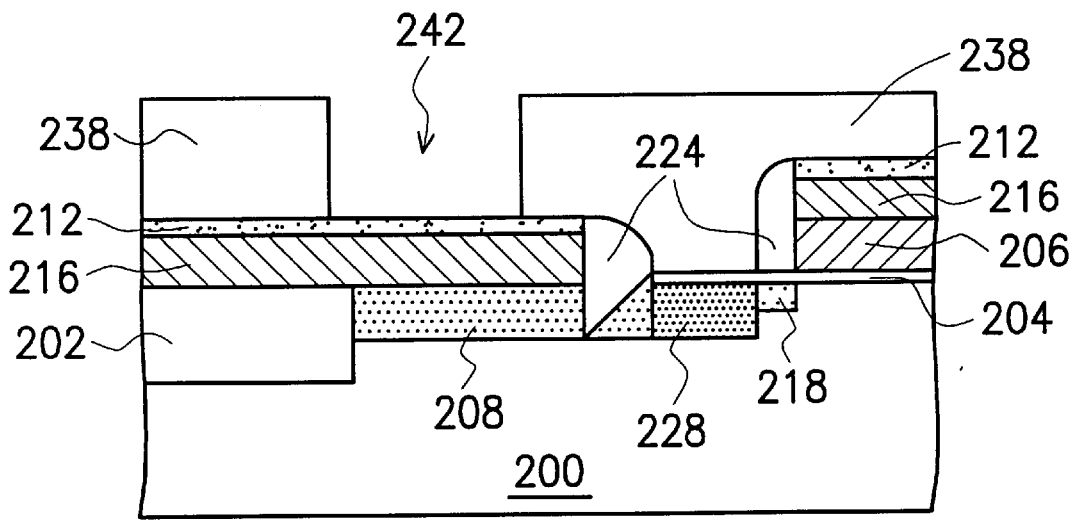
Figure 2I:
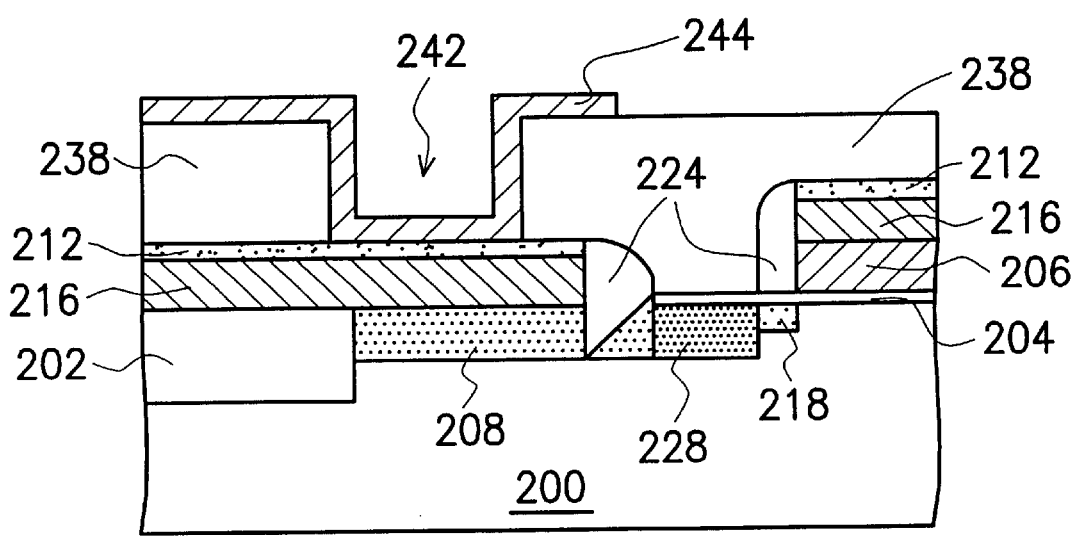

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3G are cross-sectional views showing a method of fabricating a static random access memory according to the preferred embodiment of this invention.

Figure 3A:
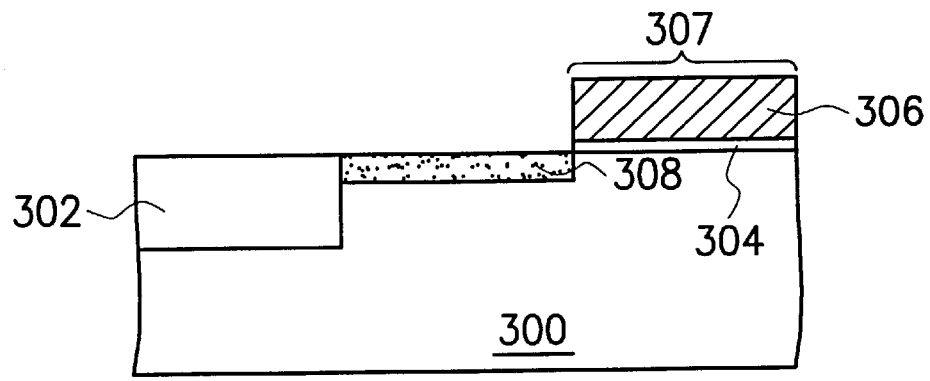
FIGS. 3A through 3G are cross-sectional views showing a method of fabricating a static random access memory according to the preferred embodiment of this invention.

As shown in FIG. 3A, a semiconductor substrate 300 having an isolating structure, for example, shallow trench isolation (STI) 302, thereon is provided. A gate oxide layer 304 having a thickness of about 40 Å to about 350 Å is formed on the substrate 300 using, for example, a thermal oxidation method. A conductive layer 306, for example, a polysilicon layer having a thickness of about 500 Å to about 2500 Å is formed over the gate oxide layer 304. After a doping process of the polysilicon layer, commonly using arsenic ions or phosphoric ions as dopents, an annealing step is performed to active the dopants. The conductivity of the polysilicon is thus enhanced. The doping process can be, for example, performed while forming the polysilicon layer, or can be performed by ion implantation after the formation of the polysilicon layer.

The conductive layer 306 and the gate oxide layer 304 are patterned using, for example, a dry etching method to form a gate 307 on a device region between the STI structures 302. Thus, the substrate 300 between the gate 307 and the STI structure 302 is exposed. An ion implantation is performed into the semiconductor substrate 300 beside the gate 307, in other words, a source/drain region 308 is formed in the regions of the semiconductor substrate 300 that is pre-determined for forming the source/drain region 308 and a buried contact. Arsenic ions or phosphoric ions are preferably used as the doping ions in the ion implantation, though other ions may also be used. The implantation is carried out using an energy level of about 40 KeV to about 80 KeV and a dosage of about $5.0 \times 10^{12}$ atoms/cm$^2$ to about $5.0 \times 10^{14}$ atoms/cm$^2$. An annealing operation is carried out to form a lightly doped N$^-$ region 308.

Figure 3B:
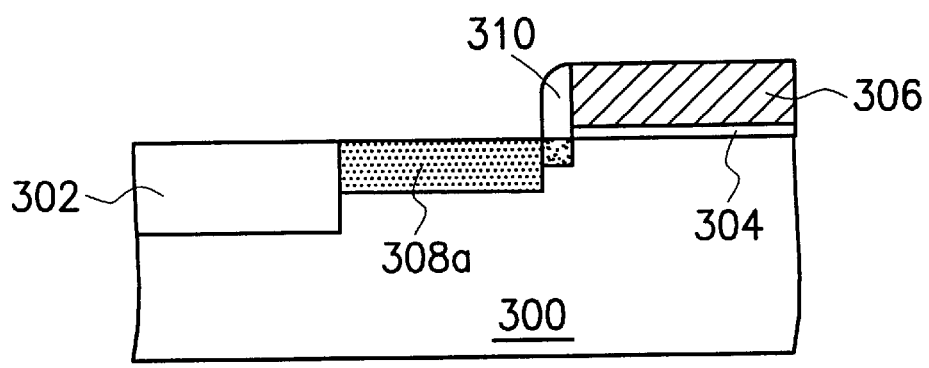

As shown as FIG. 3B, spacers 310 are formed on the sidewalls of the gate 307. It is preferably by forming an insulating layer, such as a silicon oxide layer or a silicon nitride layer, over the substrate 300, for example, by CVD. The insulating layer is etched back to form the spacers 310. An ion implantation is performed into the substrate 300 to form a heavily source/drain region using the spacers 310 as a mask. For example, arsenic ions or phosphoric ions are commonly used as the doping ions in the ion implantation. The implantation is carried out using an energy level of about 50 KeV to about 100 KeV and a dosage of about $1.0 \times 10^{15}$ atoms/cm$^2$ to about $8.0 \times 10^{15}$ atoms/cm$^2$. A source/drain region 308a having a light doped drain (LDD) structure is composed of the lightly source/drain region and the heavily source/drain region. The source/drain region 308a also has function of a buried contact.

Figure 3C:
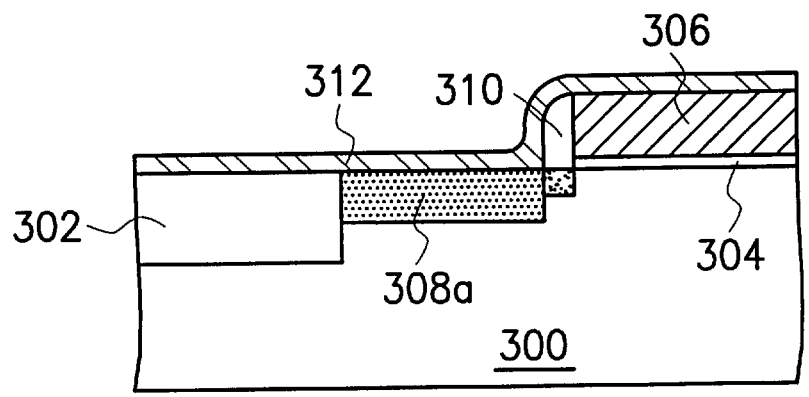

As shown in FIG. 3C, a self-aligned metal silicide (Salicide) process is carried out by forming a blanket metallic layer 312 over the entire substrate 300. The metallic layer 312 preferably having a thickness of about 300 Å to about 1000 Å can be, for example, a titanium, platinum or cobalt layer formed over the substrate 300 using a physical vapor deposition method or a chemical vapor deposition method.

Figure 3D:
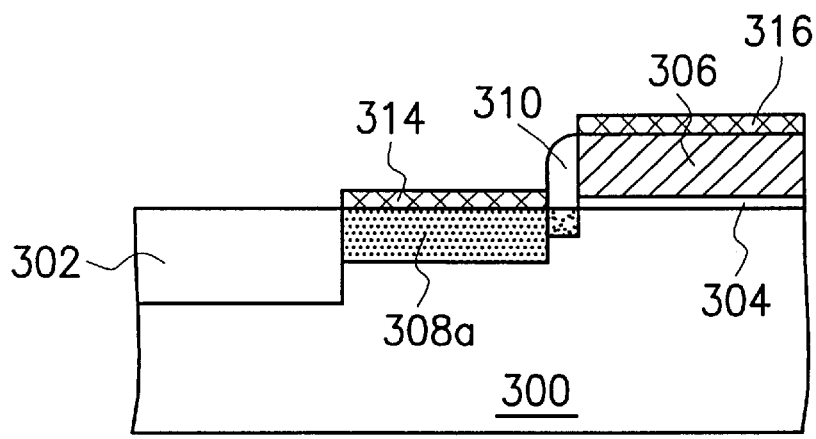

As shown in FIG. 3D, a thermal treatment is performed, for example, by rapidly heating the wafer to a temperature of about 700° C. using a rapid thermal process (RTP). Consequently, the metallic layer 312 reacts with the silicon connected with the metallic layer 312 to form a metal silicide layer 314, 316. For example, if titanium is formed over the substrate 300, a titanium silicide (TiSi$_x$) is ultimately formed. Since no reaction will occur in a region where the metal has no contact with the silicon substrate 300, a portion of the metallic layer 312 will remain.

The unreacted metallic layer 312 on the STI structure 302 and the spacers 310 are removed, for example, by a wet etching method using RCA solution, mixture solution of hydrogen peroxide, ammonium hydrooxide and water, as cleaning solution. The metal silicide layer 314 on the source/drain region 308a and the gate 307 is remained. The metal silicide layer 314 on the source/drain region 308a can lower the contact resistance between the source/drain region 308a and a conductive line of a subsequently formed buried contact. It also serves as an etching stop layer of the conductive line of the subsequently formed buried contact to avoid misalignment, leading to formation of a trench in the buried contact.

Figure 3E:
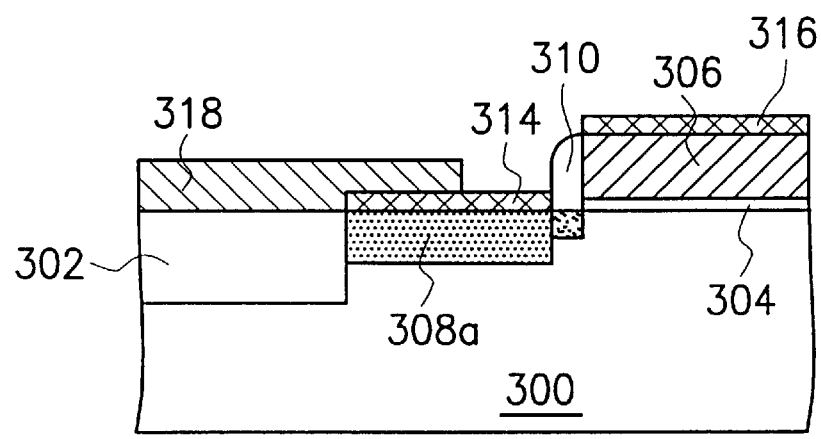

As shown in FIG. 3E, a conductive layer is formed over the semiconductor substrate 300 using, for example, a low-pressure chemical vapor deposition (LPCVD). The conductive layer can be a polysilicon layer preferably having a thickness of about 1000 Å to 4000 Å. A photoresist layer (not shown) is formed over the conductive layer. A conductive line 318, being electrically coupled to the metal silicide layer 314 on the source/drain 308a, is formed, for example, by a reactive ion etching (RIE) method.

In the invention, although the source/drain region 308a and the conductive line 318 are made from the same material (silicon), a metal silicide layer 314 is specifically formed on the source/drain region 308a of the buried contact window region. In addition to lowering the contact resistance between the conductive line 318 and the source/drain region 308a, that is the buried contact region, the metal silicide layer 314 can serve as an etching stop when the conductive line layer 318 is patterned. Hence, misalignment and subsequent over-etching of the source/drain region 308a to form a trench due to misalignment can be avoided. A trench in the source/drain region 308 can lead to a reduction of its cross-sectional area and can result in a higher resistance. In the worst case, the trench may create an open-circuit condition inside the source/drain region 308a, that is the buried contact regions.

Figure 3F:
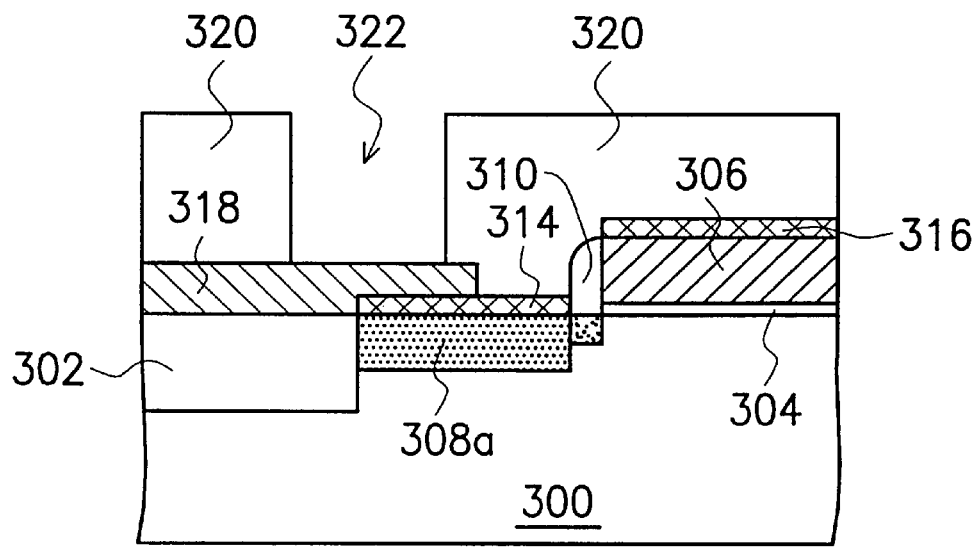

As shown in FIG. 3F, a dielectric layer 320, such as an oxide layer, is formed over the substrate 300, for example, by CVD. A planarization method, such as a chemical mechanical polishing (CMP) method, is performed to make the dielectric layer and a subsequently formed via having the same surface level. A via 322 is formed in the dielectric layer 320 to expose the conductive line 318 for forming the desired via 322 by a photolithography and an etching methods.

Figure 3G:
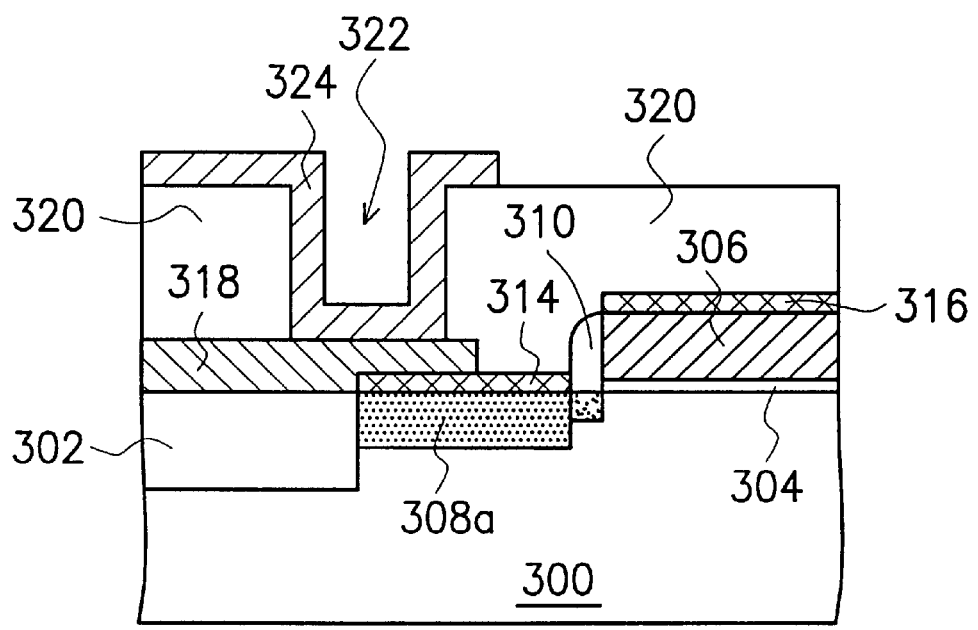

As shown in FIG. 3G, a poly load 324 is formed along the via 322 for being electrically coupled to the conductive line 318. The step is preferably to form a polysilicon layer conformal to the dielectric layer 320 and the via 322, for example, by CVD. Then, the polysilicon layer is patterned to form a polysilicon conductive line, being electrically coupled to the conductive line 318. An ion implantation is performed for adjusting the resistance of the polysilicon conductive layer to form the poly load 324.

Subsequent processes for forming the SRAM are carried out. Since these operations are not directly related to the invention, detailed description is omitted here.

In summary, features of the invention include:

1. The metal silicide layer formed on the source/drain region of a buried contact window can serve as an etching stop layer while patterning a conductive line, being electrically coupled to a source/drain region, that is the buried contact region. Hence, the formation of a trench in the source/drain region due to misalignment and over-etching is avoided. A trench in the source/drain region can lead to a reduction of cross-sectional area of the buried contact region and can result in a higher resistance. In some serious cases, the trench may be so deep as to create an open-circuit condition inside the heavily doped N$^+$ region.

2. By forming a metal silicide layer on the source/drain region of the buried contact window, contact resistance between the conductive line region and the source/drain region, that is the buried contact region, is lowered.

3. Methods used in this invention are compatible with current manufacturing processes. Hence, the invention can be readily incorporated into an existing production facility.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a static random access memory, comprising the steps of:

provide a substrate:

forming an oxide layer and a first conductive layer on the substrate;

patterning the first conductive layer and the oxide layer to form a gate having sidewalls;

performing a first ion implantation to form a lightly doped region in the portion of the substrate beside the gate;

forming spacers on the sidewalls of the gate;

performing a second ion implantation to form a heavily doped region in the portion of the substrate beside the spacers wherein the lightly doped region and the heavily doped region compose a source/drain region;

forming a metallic layer over the substrate;

performing a thermal treatment to convert a portion of the metallic layer into a metal silicide layer on the gate and the source/drain region;

removing remaining portion of the metallic layer without forming the metal silicide layer;

forming a second conductive layer over the substrate;

patterning the second conductive layer to form a conductive line, being electrically coupled to the metal silicide layer on the source/drain region;

forming a dielectric layer having a via exposing the conductive line by the via over the substrate;

forming a polysilicon layer conformal to the dielectric layer and the via;

patterning the polysilicon layer to form a polysilicon conductive line wherein the polysilicon conductive line is electrically coupled to the conductive line; and performing a third ion implantation to form a poly loan over the via.

2. A method according to claim 1, wherein the material of the first conductive layer comprises polysilicon.

3. A method according to claim 1, wherein the step of patterning the first conductive layer and the oxide layer comprises a dry etching method.

4. A method according to claim 1, wherein the metallic layer includes one of a group consisting of titanium, platinum or cobalt.

5. A method according to claim 1, wherein the thickness of the metallic layer is from about 300 Å to about 1000 Å.

6. A method according to claim 1, wherein the thermal treatment comprises a rapid thermal process.

7. A method according to claim 1, wherein the material of the second conductive layer comprises polysilicon.

8. A method according to claim 1, wherein the step of patterning the second conductive layer comprises a reactive ion etching method.

9. A method according to claim 1, wherein the material of the dielectric layer comprises oxide.

10. A method of fabricating a static random access memory, comprising the steps of:

providing a substrate having a gate composed of an oxide layer and a first conductive layer;

forming a source/drain region in the substrate beside the gate;

forming metal silicide layers on the source/drain region and on the gate;

forming a conductive line over the substrate to be electrically coupled to the metal silicide layer on the source/drain region, wherein the conductive line covers a portion only of the metal silicide layer on the source/drain region;

forming a dielectric layer having a via exposing the conductive line by the via over the substrate;

forming a polysilicon conductive line conformal to the via and the dielectric layer wherein the polysilicon conductive line is electrically coupled to the conductive line; and performing an ion implantation to form a poly load.

11. A method according to claim 10, wherein the material of the first conductive layer comprises polysilicon.

12. A method according to claim 10, wherein the step of forming the source/drain region comprises:

performing a first ion implantation to form a lightly doped region in the substrate beside the gate;

forming spacers on the sidewalls of the gate; and performing a second ion implantation to form a heavily doped region using the spacers as a mask wherein the lightly doped region and the heavily doped region compose the source/drain region.

13. A method according to claim 10, wherein the step of forming the metal silicide layer comprises:

forming a metallic layer over the substrate;

performing a thermal treatment to convert a portion of the metallic layer into the metal silicide layer on the gate and on the source/drain region; and removing remaining portion of the metallic layer.

14. A method according to claim 13, wherein the metallic layer includes one of a group consisting of titanium, platinum or cobalt.

15. A method according to claim 13, wherein the thickness of the metallic layer is from about 300 Å to about 1000 Å.

16. A method according to claim 13, wherein the thermal treatment comprises a rapid thermal process.

17. A method according to claim 10, wherein the material of the conductive line comprises polysilicon.

18. A method according to claim 10, wherein the material of the dielectric layer comprises silicon oxide.

19. A method according to claim 10, wherein the step of forming the polysilicon conductive line comprises:

forming a polysilicon layer conformal to the dielectric layer and the via; and patterning the polysilicon layer to form the polysilicon conductive line which is electrically coupled to the conductive line.

* * * * *